(12) United States Patent
Shen

(10) Patent No.: US 10,796,952 B1
(45) Date of Patent: Oct. 6, 2020

(54) MEMORY DEVICE AND METHOD OF FABRICATING THE SAME

(71) Applicant: MACRONIX International Co., Ltd., Hsinchu (TW)

(72) Inventor: Kuan-Yuan Shen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/547,014

(22) Filed: Aug. 21, 2019

(51) Int. Cl.
| | |
|---|---|
| *H01L 21/768* | (2006.01) |
| *H01L 27/11582* | (2017.01) |
| *H01L 27/11578* | (2017.01) |
| *H01L 23/528* | (2006.01) |
| *H01L 27/11551* | (2017.01) |
| *H01L 27/11514* | (2017.01) |

(52) U.S. Cl.
CPC .. *H01L 21/76831* (2013.01); *H01L 21/76802* (2013.01); *H01L 23/5283* (2013.01); *H01L 27/11578* (2013.01); *H01L 27/11582* (2013.01); *H01L 27/11514* (2013.01); *H01L 27/11551* (2013.01)

(58) Field of Classification Search
CPC ......... H01L 21/76831; H01L 21/76802; H01L 23/5283; H01L 27/11578; H01L 27/11582; H01L 27/11551; H01L 27/11514
See application file for complete search history.

(56) References Cited

U.S. PATENT DOCUMENTS

| | | | |
|---|---|---|---|
| 2015/0084204 A1* | 3/2015 | Yun | ........... H01L 27/11529 257/773 |
| 2017/0133389 A1 | 5/2017 | Yun et al. | |

FOREIGN PATENT DOCUMENTS

| | | |
|---|---|---|
| TW | I643317 | 12/2018 |

OTHER PUBLICATIONS

"Office Action of Taiwan Counterpart Application", dated Feb. 14, 2020, p. 1-p. 5.

\* cited by examiner

*Primary Examiner* — Feifei Yeung Lopez
(74) *Attorney, Agent, or Firm* — J.C. Patents

(57) ABSTRACT

Provided is a memory device, including a stacked structure, a pillar, a first stop layer, and a contact plug. The stacked structure includes a plurality of conductive layers. The pillar penetrates the plurality of series-connected memory cells. The plurality of series-connected memory cells are located in a layout pattern of pillar locations at cross-points between the pillar and the conductive layers. The first stop layer covers the stacked structure and a portion of a top surface of the pillar. The contact plug passes through the first stop layer, extending into the pillar, and is electrically connected to the plurality of series-connected memory cells. The contact is landed on the contact plug, and is electrically connected to a portion of the pillar through the contact plug.

8 Claims, 16 Drawing Sheets

MEMORY DEVICE AND METHOD OF FABRICATING THE SAME

BACKGROUND

Technical Field

The present disclosure relates to a memory device and a method of fabricating the same.

Description of Related Art

With development of technologies, advancements in electronic devices lead to increasing demands for greater storage capabilities. In order to satisfy the need for high storage density, memory devices are designed to include smaller size and higher integration. Accordingly, a structure of the memory device has been developed to change from a 2D memory device with a planar gate structure into a 3D memory device with a vertical channel (VC) structure. However, a three-dimensional memory device with a vertical channel structure still faces many challenges.

SUMMARY

The present disclosure is directed to a memory device and method of fabricating the same, which may increase the process window and improve the reliability of the memory device.

The embodiment of the disclosure provides a memory device, including a stacked structure, a pillar, a first stop layer, and a contact plug. The stacked structure includes a plurality of conductive layers. The pillar penetrates through the stacked structure. The pillar includes a plurality of series-connected memory cells. The plurality of series-connected memory cells are located in a layout pattern of pillar locations at cross-points between the pillar and the conductive layers. The first stop layer covers the stacked structure and a portion of a top surface of the pillar. The contact plug penetrates through the first stop layer, extending into the pillar, and is electrically connected to the plurality of series-connected memory cells. The contact is landed on the contact plug, and is electrically connected to a portion of the pillar through the contact plug.

The embodiment of the present disclosure also provides a method for fabricating a memory device. A pillar having a recess is formed in the stacked structure. A stop material layer is formed on the stacked structure and the pillar and formed in the recess. The stop material layer on the sidewalls of the recess is removed to form a stop layer on the stacked structure, and a second stop layer on a bottom surface of the recess. A contact plug is formed in the recess. A dielectric layer is formed on the first stop layer and the contact plug. A contact is formed in the dielectric layer to electrically connect to the contact plug.

Based on the above, the embedment of the present disclosure may protect the charge storage layer and the channel layer by the formation of the first stop layer so that the pillar do not suffer from etching damage when forming a contact opening. In addition, the contact may not only land on the contact plug, but also land on the first stop layer. Therefore, the embedment of the present disclosure may increase the process window and improve the reliability of the memory device with the vertical channel structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1A to FIG. 1H are a schematic cross-sectional view showing a fabricating process of a memory device according to a first embodiment of the present disclosure. FIG. 2 is a top view of FIG. 1H. The memory device described in the following disclosure may be a single gate vertical channel (SGVC) NAND memory, but the disclosure is not limited thereto.

Figure 1A:
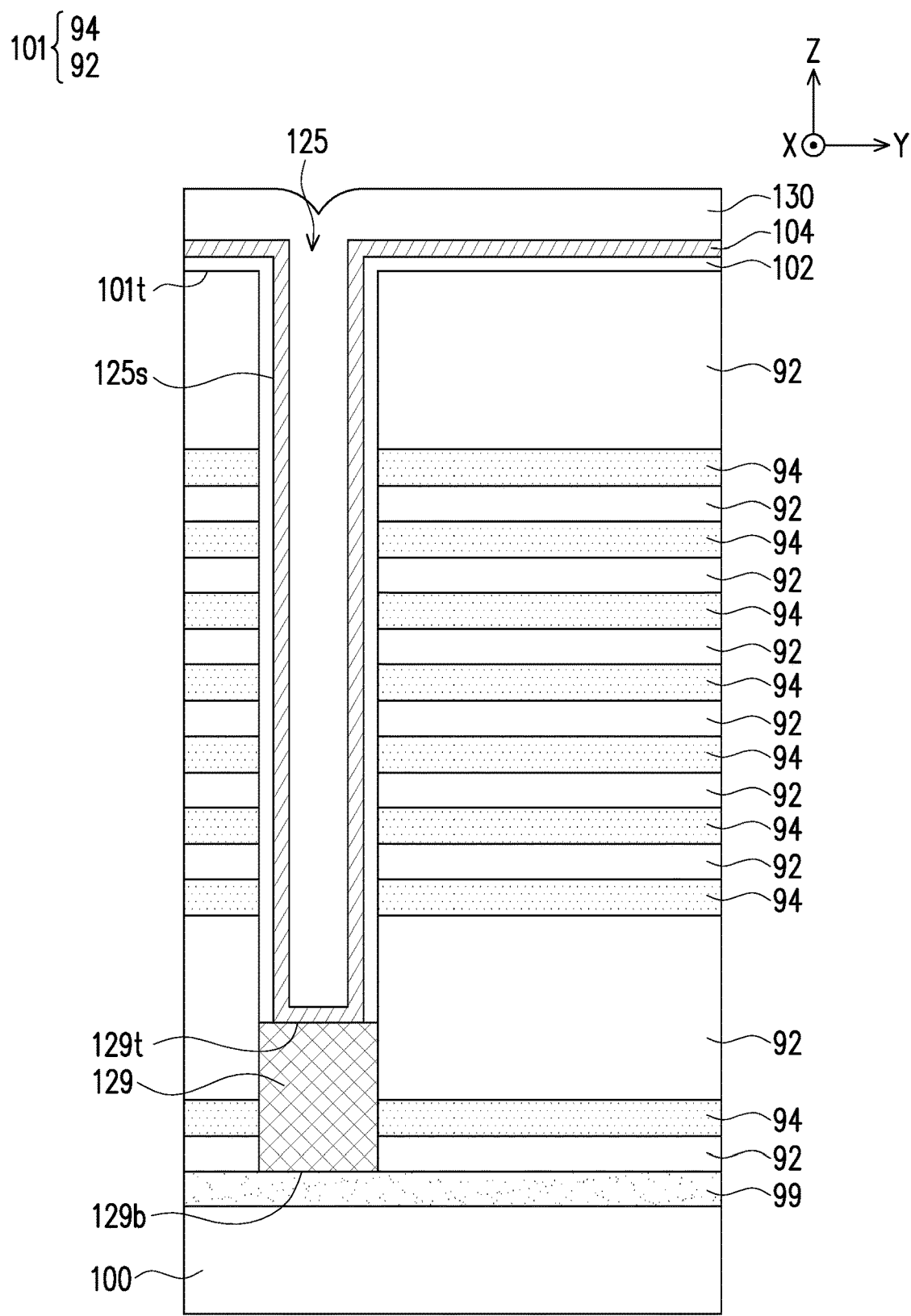
FIG. 1A to FIG. 1H are a schematic cross-sectional view showing a fabricating process of a memory device according to a first embodiment of the present disclosure.

Referring to FIG. 1A, the fabricating method of the first embodiment of the memory device 10 (shown as FIG. 1H) of the present disclosure is as follows. First, a substrate 100 is provided. In an embodiment, the substrate 100 includes a semiconductor substrate, such as a silicon substrate. In some embodiments, a doped region (e.g., an N+ doped region or an N-type well region) 99 may be formed in the substrate 100 according to the design requirements. The stacked structure 101 includes a plurality of dielectric layer layers 92 and a plurality of sacrifice layers 94 which are alternately stacked. The material of the dielectric layer 92 includes a dielectric material, such as silicon oxide. The material of the sacrifice layer 94 is different from the dielectric layer 92 and exhibits a sufficient etching selectivity with respect to the dielectric layer 92. In some embodiments, the material of the sacrifice layer 94 is, for example, silicon nitride. The dielectric layer layers 92 and the sacrifice layers 94 are formed by performing a chemical vapor deposition process multiple times, for example. The number of layers of the dielectric layer layers 92 and the number of layers of the sacrifice layers 94 in the stacked structure 101 may be 8, 16, 32, 56, 64, or 96, for example. However, the disclosure is not limited thereto. The numbers of layers of the dielectric layer layers 92 and the sacrifice layers 94 in the stacked structure 101 may be determined by the design and the density of a memory device.

Referring to FIG. 1A, the stacked structure 101 is patterned to form an opening 125 penetrating through the stacked structure 101. As shown in FIG. 2, opening 125 may be a hole. The cross-sectional view of the opening 125 may circular-shaped, oval-shaped, the like or any other suitable shaped. The number of opening 125 may be multiple.

Thereafter, a contact 129 is formed in the opening 125. The contact 129 may be doped polysilicon or doped single crystal silicon. The contact 129 may be formed by an epitaxial growth process. In some embodiments, a bottom surface 129b of the contact 129 may be in contact with a doped region 99 in the substrate 100. The doped region 99 may be used as the source region. The contact 129 is also referred to as a source contact.

Next, a charge storage layer 102 is formed on substrate 100. In an embodiment, the charge storage layer 102 covers a top surface 101t of the stacked structure 101 and extends to cover sidewalls 125s of the opening 125. In another embodiment, the charge storage layer 102 over the top surface 101t of the stacked structure 101 may be removed before forming the channel layer 104. The charge storage layer 102 may be oxide/nitride/oxide (ONO) composite layer, oxide/nitride/oxide/nitride/oxide (ONONO) composite layer, silicon/oxide/nitride/oxide/silicon (SONOS) or other suitable a composite layer. The charge storage layer 102 may be formed by processes such as chemical vapor deposition (CVD), thermal oxidation, nitridation, etching, and/or the like.

Thereafter, a channel layer 104 is formed on the substrate 100. The channel layer 104 may conformally cover the charge storage layer 102 and the top surface 129t of the contact 129. In an embodiment, the channel layer 104 includes a doped semiconductor material, an undoped semiconductor material, or a combination thereof. For example, the channel layer 104 may be formed of an undoped polysilicon layer via a chemical vapor deposition process or a physical vapor process, and then formed through an anneal process. In some embodiments, the contact 129 is single crystal silicon and the channel layer 104 is polysilicon. The polysilicon of the channel layer 104 being in contact with the contact 129 crystallizes into single crystal silicon after the anneal process is performed, and is combined with the contact 129.

Next, a filling material layer 130 is formed on the substrate 100. The filling material layer 130 covers the channel layer 104 and fills the opening 125. The filling material layer 130 includes an insulating material, for example, silicon oxide, silicon nitride, silicon oxynitride, other suitable dielectric materials, or a combination thereof formed by a chemical vapor deposition method.

Figure 1B:
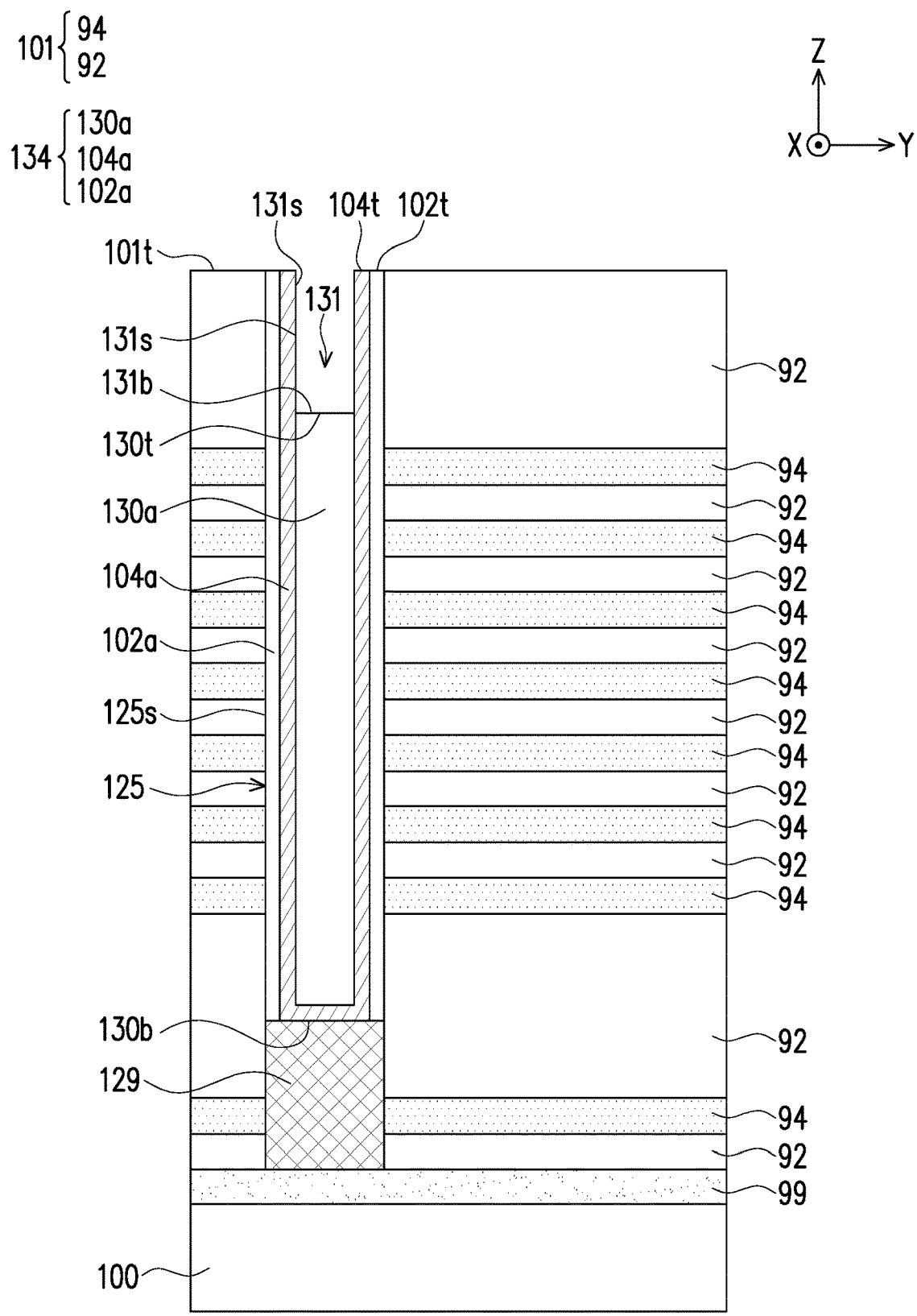

Thereafter, referring to FIG. 1B, a portion of the filling material layer 130 is removed by, for example, anisotropic etching, isotropic etching, or a combination thereof, to form an insulating filler 130a in the opening 125 and a recess 131 on the insulating filler 130a. The removing process may be a single-stage etching process, a two-stage etching process, a multi-stage etching process a chemical mechanical planarization (CMP) process or a combination thereof.

In an embodiment, the portion of the filling material layer 130 is removed using a two-stage etching process. The first stage of the etching process is a first etching back process to partially remove the filling material layer 130 until a surface of the channel layer 104 on the top surface 101t of the stacked structure 101 is exposed. The second stage of the etching process is a second etching back process to partially remove a portion of the insulating filler remaining in the opening 125 so as to form the insulating filler 130a having the recess 131 thereon. The etching rate of the first stage may be greater than or equal to the etching rate of the second stage. The etching selectivity of the second stage is greater than the etching selectivity of the first stage. That is, compared to the second stage, the first stage may use an etching process with a lower etching selectivity of the channel layer 104 and the insulating filler 130, such as dry etching using hydrogen bromide (HBr) and oxygen ($O_2$), or chlorine ($Cl_2$) and oxygen ($O_2$) as an etching gas. Compared to the first stage, the second stage may use an etching process with a higher etching selectivity of the channel layer 104 and the insulating filler 130, such as a SICONI etching process.

, After the recess 131 is formed, an etch back process, for example, anisotropic etching, isotropic etching, or a combination thereof, is performed on the channel layer 104 and the charge storage layer 102 to expose the top surface 101t of the stacked structure 101, so that the channel layer 104a and the charge storage layer 102a in the opening 125 are left.

In another embodiment, the insulating filler 130, the channel layer 104, and the charge storage layer 102 on the top surface 101t of the stacked structure 101 may be removed by chemical mechanical polishing or etch back to expose the top surface 101t of the stacked structure 101. Thereafter, an etch back process is performed to remove portion of the insulating filler in the openings 125. Thereby, the channel layer 104a, the charge storage layer 102a, and the insulating filler 130a having the recess 131 are formed.

A top surface 102t of the charge storage layer 102a, a top surface 104t of the channel layer 104a, and the top surface 101t of the stacked structure 101 have substantially at the same level. In some embodiments, the top surface 102t of the charge storage layer 102a, the top surface 104t of the channel layer 104a, and the top surface 101t of the stacked structure 101 are coplanar. In some embodiments, the top surface 102t of the charge storage layer 102a and the top surface 104t of the channel layer 104a are slightly lower than the top surface 101t of the stacked structure 101, and higher than a top surface 130t of the insulating filler 130a.

After that, a pillar 134 is formed in the stacked structure 101. The pillar 134 penetrates through the stacked structure 101, extending in the Z direction. A bottom surface 134b of the pillar 134 is in physical contact with the contact 129. A top surface of the pillar 134 has the recess 131. The pillar 134 includes the charge storage layer 102a, the channel layer 104a, and the insulating filler 130a. The insulating filler 130a is a core of the pillar 134 and is disposed in the stacked structure 101. The top surface 130t of the insulating filler 130a is lower than the top surface 101t of the stacked structure 101, thereby forming the recess 131. A bottom surface 131b of the recess 131 exposes the insulating filler 130a. Sidewalls 131s of the recess 131 expose the channel layer 104a.

The channel layer 104a is a vertical channel layer. The channel layer 104a is disposed in the first stacked structure 101 and is located at the sidewalls of the insulating filler 130a and extends upwardly from the top surface 130t of the insulating filler 130a. The channel layer 104a under the bottom surface 130b of the insulating filler 130a may remain or crystallize during the anneal process and merge with the contact 129. The charge storage layer 102a is located between the channel layer 104a and the stacked structure 101. After that, referring to FIG. 1C, a stop material layer 136 is formed on substrate 100. The stop material layer 136 includes a first portion P1, a second portion P2, and a third portion P3. The first portion P1 covers the top surface of the stacked structure 101 and the pillar 134. The second portion P2 covers the insulating filler 130a below the bottom surface 131b of the recess 131. The third portion P3 is located on the sidewalls 131s of the recess 131 to cover the channel layer 104a. In the present embodiment, the thicknesses of the first portion P1, the second portion P2, and the third portion P3 may be different. The thickness of the third portion P3 is smaller than the thickness of the second portion P2 and smaller than the thickness of the first portion P1. The thickness of the second portion P2 may be less than or equal to the thickness of the first portion P1. For example, the thickness of P2 is 50% to 80% of the thickness of P1, and the thickness of P3 is 10% to 30% of the thickness of P1. The material of stop material layer 136 includes silicon oxide, silicon nitride, silicon oxynitride, silicon carbide or a combination thereof CVD. In some embodiments, the stop material layer 136 includes a material different form the topmost dielectric layer 92.

Figure 1C:
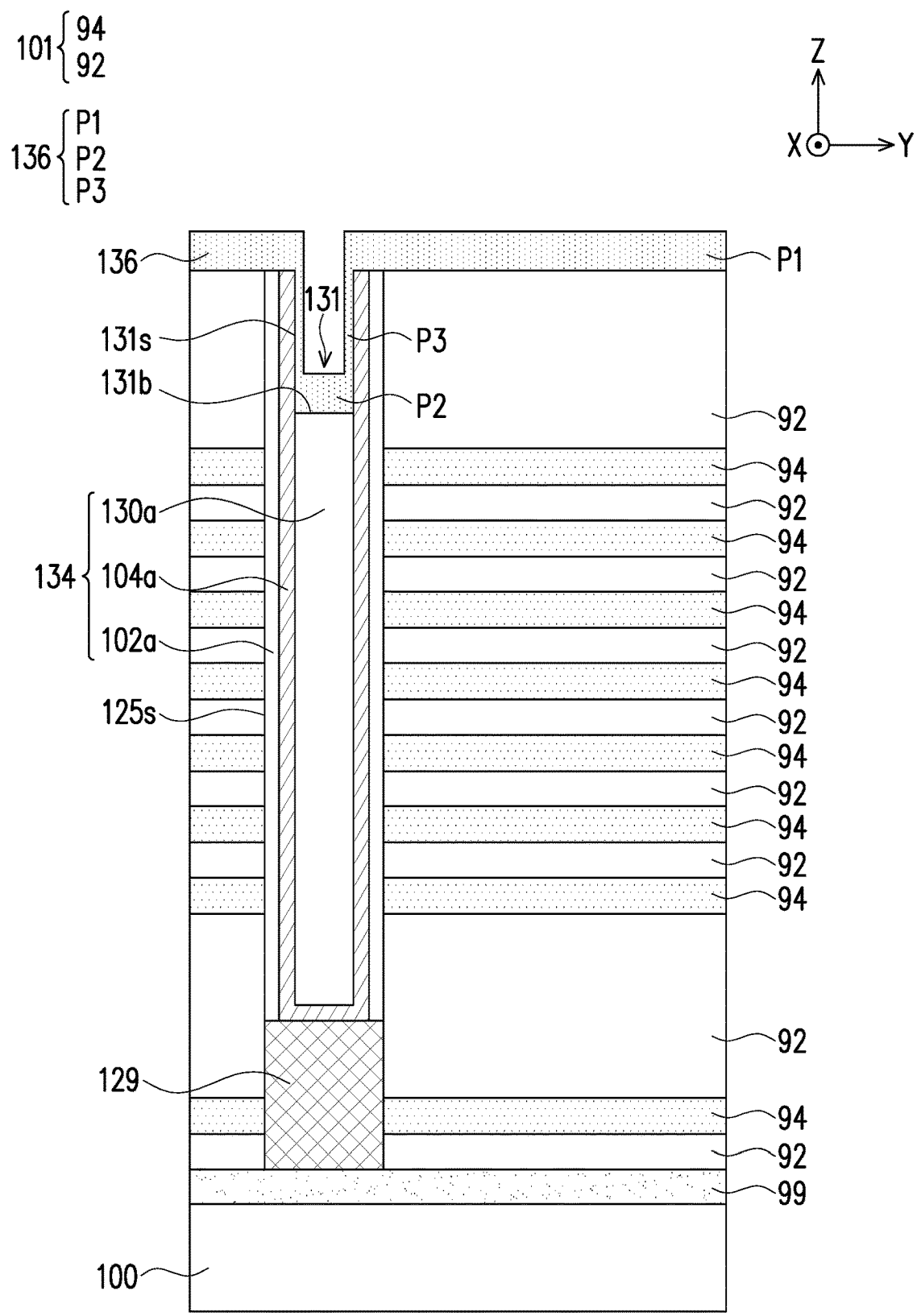
Figure 1D:
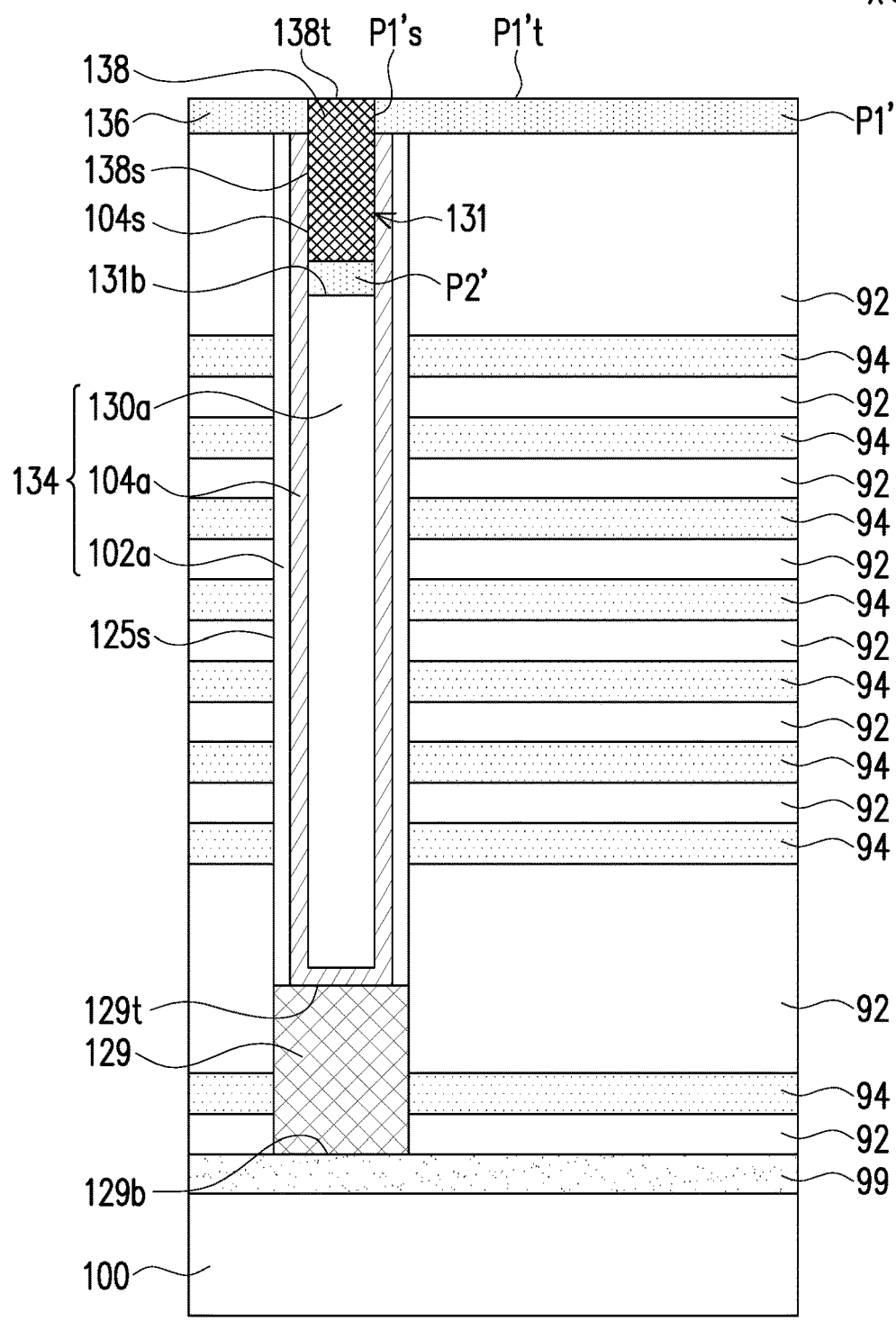

Referring to FIG. 1C and FIG. 1D, an etch process, for example, a dry etching process, a wet etching process, or a combination thereof is performed to partially remove the stop material layer 136 until the sidewalls 131s of recess 131 are exposed. In an embodiment, the above etching process is, for example, a SICONI process. All the first portion P1, the third portion P3, and the second portion P2 of the stop material layer 136 are etched while the etching process is performed. However, due to the third portion P3 has the thinnest thickness, the sidewalls 131s of the recess 131 is exposed first. The first portion P1 and the second portion P2 may have a loss to reduce the thicknesses, and a first portion P1' and a second portion P2' are left. The first portion P1' (also referred to as a first stop layer P1') still cover the stacked structure 101, and the charge storage layer 102a and channel layer 104a of the pillar 134. The second portion P2' (also referred to as the second stop layer P2') still cover the insulating filler 130a.

Referring to FIG. 1D, a contact plug 138 is formed in recess 131. The contact plug 138 includes a semiconductor, a metal, a metal alloy, or a combination thereof. The material of the contact plug 138 is, for example, doped polysilicon, tungsten, platinum, or a combination thereof. The formation of the contact plug 138 is, for example, as follows. A conductive material layer is formed to cover the first stop layer P1', and fill in the recess 131. Thereafter, an etching back or a chemical mechanical polishing process is performed to remove the conductive material layer on the first stop layer P1'. The contact plug 138 penetrates through the first stop layer P1' and extends in the Z direction to be in physical contact with the second stop layer P2'. In an embodiment, a top surface 138t of the contact plug 138 may be coplanar with a top surface P1't of the first stop layer P1'. In another embodiment, the top surface 138t of the contact plug 138 may be slightly lower than the top surface P1't of the first stop layer P1'. In addition, the contact plug 138 is surrounded by the first stop layer P1' and the channel layer 104a, and the sidewalls 138s of the contact plug 138 are in physical contact with the sidewalls P1's of the first stop layer P1' and the sidewalls 104s of the channel layer 104a.

Figure 1E:
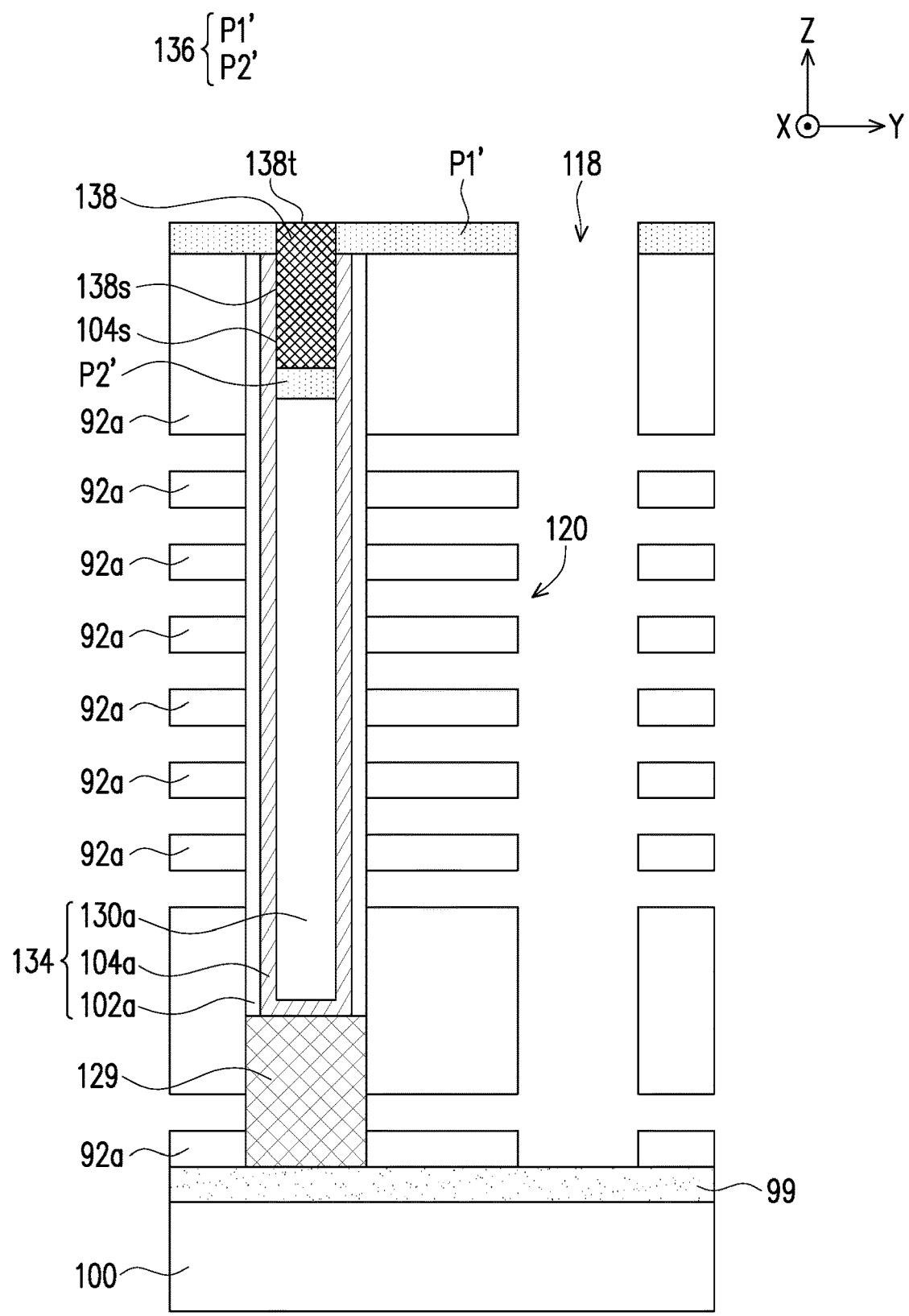

Referring to FIG. 1D and FIG. 1E, the stop material layer 136 and the stacked structure 101 are patterned to form an opening (also referred to as a trench) 118. In some embodiments, in the patterning process, a portion of the substrate 100 may meanwhile be removed such that the opening 118 exposes the doped region 99 in the substrate 100. Moreover, after performing the patterning process on the dielectric layer layers 92, the remaining portion of the dielectric layer layers 92 forms dielectric layers 92a.

Then, the sacrifice layers 94 exposed by the opening 118 are removed to form lateral openings 120 exposing portions of the charge storage layer 102, the insulating layers 102a and contact 129. The method of removing the sacrifice layers 94 exposed by the opening 118 is, for example, a dry etching process or a wet etching process. The etchant used in the dry etching process is, for example, $NF_3$, $H_2$, HBr, $O_2$, $N_2$, He or a combination thereof. The etchant used in the wet etching process is, for example, a $H_3PO_4$ solution.

Referring to FIG. 1E, a thermal oxidation process is performed to oxidize a surface of the contact 129 exposed by the lateral opening 120 to form a contact 129a and an insulating layer 121. Thereafter, a conductive layer 122 is formed in the lateral opening 120. The conductive layer 122 may be formed by depositing a gate material layer in the opening 118 and the lateral opening 120, and etching back the gate material layer. The gate material layer includes a buffer material layer, a barrier material layer, and a gate conductive material layer which are sequentially formed. The buffer material layer is formed between the barrier material layer and the charge storage layer 102a and on the surfaces of the insulating layers 92a. The material of the buffer material layer is, for example, a high-k material having a dielectric constant greater than 7, such as $Al_2O_3$, $HfO_2$, $La_2O_5$, a transition metal oxide, a lanthanide series oxide, or a combination thereof. The method of forming the buffer material layer is, for example, a chemical vapor deposition process or an atomic layer deposition (ALD) process. The buffer material layer may improve the erasing and programming properties. The material of the barrier material layer is, for example, Ti, TiN, Ta, TaN, or a combination thereof. The barrier material layer is located between the buffer material layer and the gate conductive material layer. The method of forming the barrier material layer is, for example, a chemical vapor deposition process. The material of the gate conductive material layer is, for example, polysilicon, amorphous silicon, W, Co, Al, $WSi_x$, or $CoSi_x$. The method of forming the gate conductive material layer is, for example, a chemical vapor deposition process.

The conductive layers 122 includes conductive layers 122a-122h. The conductive layer 122a in electrically insulated from the contact 129a by the insulating layer 121. In some embodiments, the conductive layers 122a may be a ground select line (GSL). The topmost conductive layer 122h may be a string select line (SSL). The conductive layers 122g may be a dummy word line (DWL). The conductive layers 122f, 122e, 122d, 122c, and 122b may be word lines WL0, WL1, WL2, WL3, and WL4. The dummy word line DWL may be disposed below the string select line SSL and above the topmost word line, or below the bottom word line, or a combination thereof. The dummy word line may have one layer, two layers, or multiple layers. Although the FIG. 1F only shows five word lines WL0, WL1, WL2, WL3, and WL4, the present disclosure is not limited thereto. In addition, the pillar 134 includes a plurality of series-connected memory cells, and the plurality of series-connected memory cells are located in a layout pattern of the pillar locations at the cross-points between the pillar 134 and the plurality of conductive layers 122f, 122e, 122d, 122c, and 122b of the stacked structure 101.

Figure 1F:
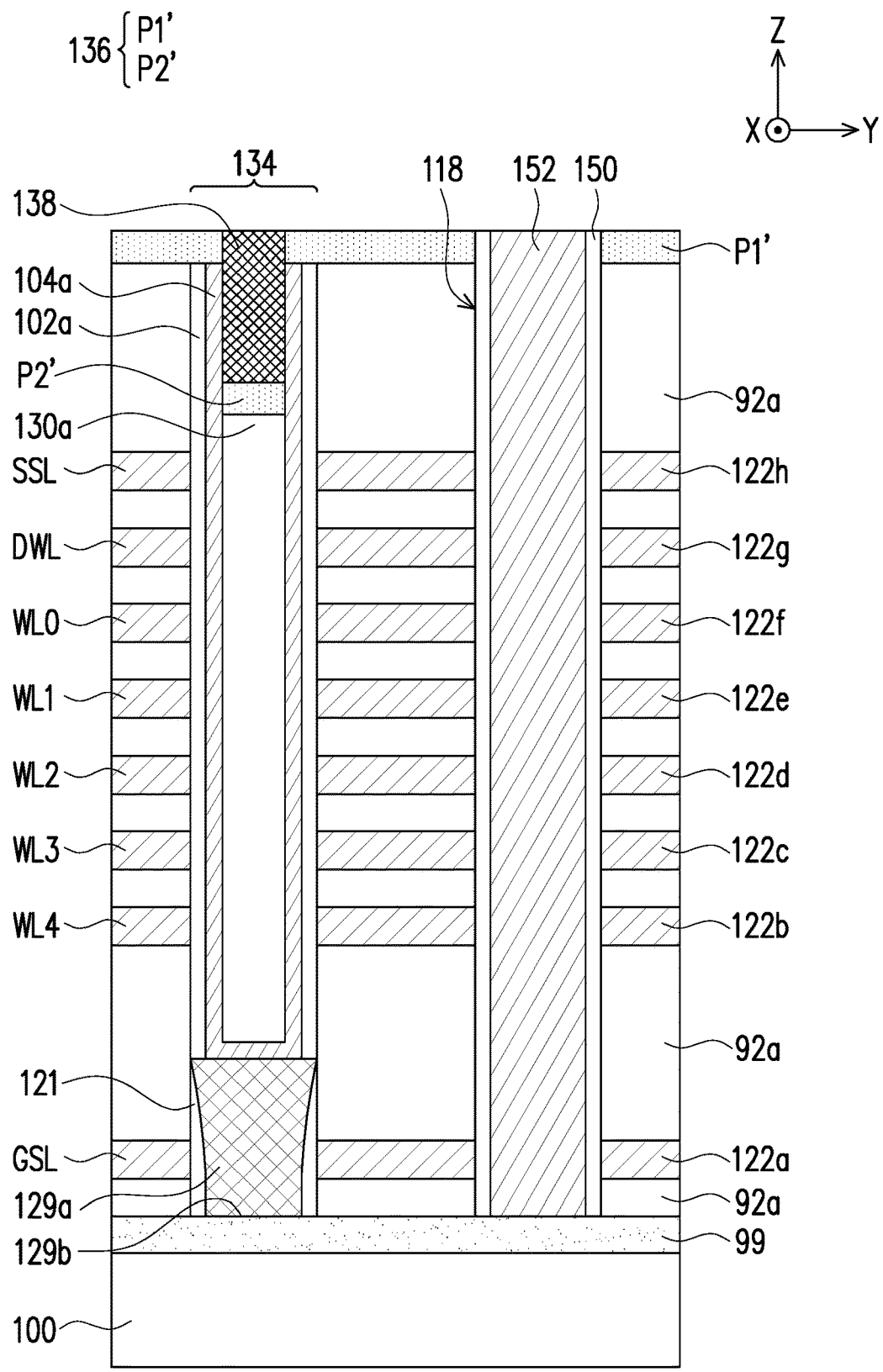

Referring to FIGS. 1E and 1F, an insulating layer 150 is formed sidewalls of the opening 118. In some embodiments, the material of the insulating layer 150 is, for example, silicon oxide. The insulating layer 150 is formed by, for example, depositing an insulating material layer by a chemical vapor deposition process or an atomic layer deposition (ALD) process. Next, an anisotropic etching process is performed to remove the insulating material layer at the bottom of the opening 118.

A conductive layer 152 is filled in the opening 118 to be electrically connected to the doped region 99 in the substrate 100. The conductive layer 152 may include a barrier layer and a metal layer. The material of the barrier layer is, for example, Ti, TiN, Ta, TaN, or a combination thereof. The method of forming the barrier layer is, for example, a chemical vapor deposition process. The material of the metal layer is, for example, W, polysilicon, Co, $WSi_x$, or $CoSi_x$. The method of forming the metal layer is, for example, a chemical vapor deposition process. In some embodiments, the conductor layer 152 may serve as a common source line.

Figure 1G:
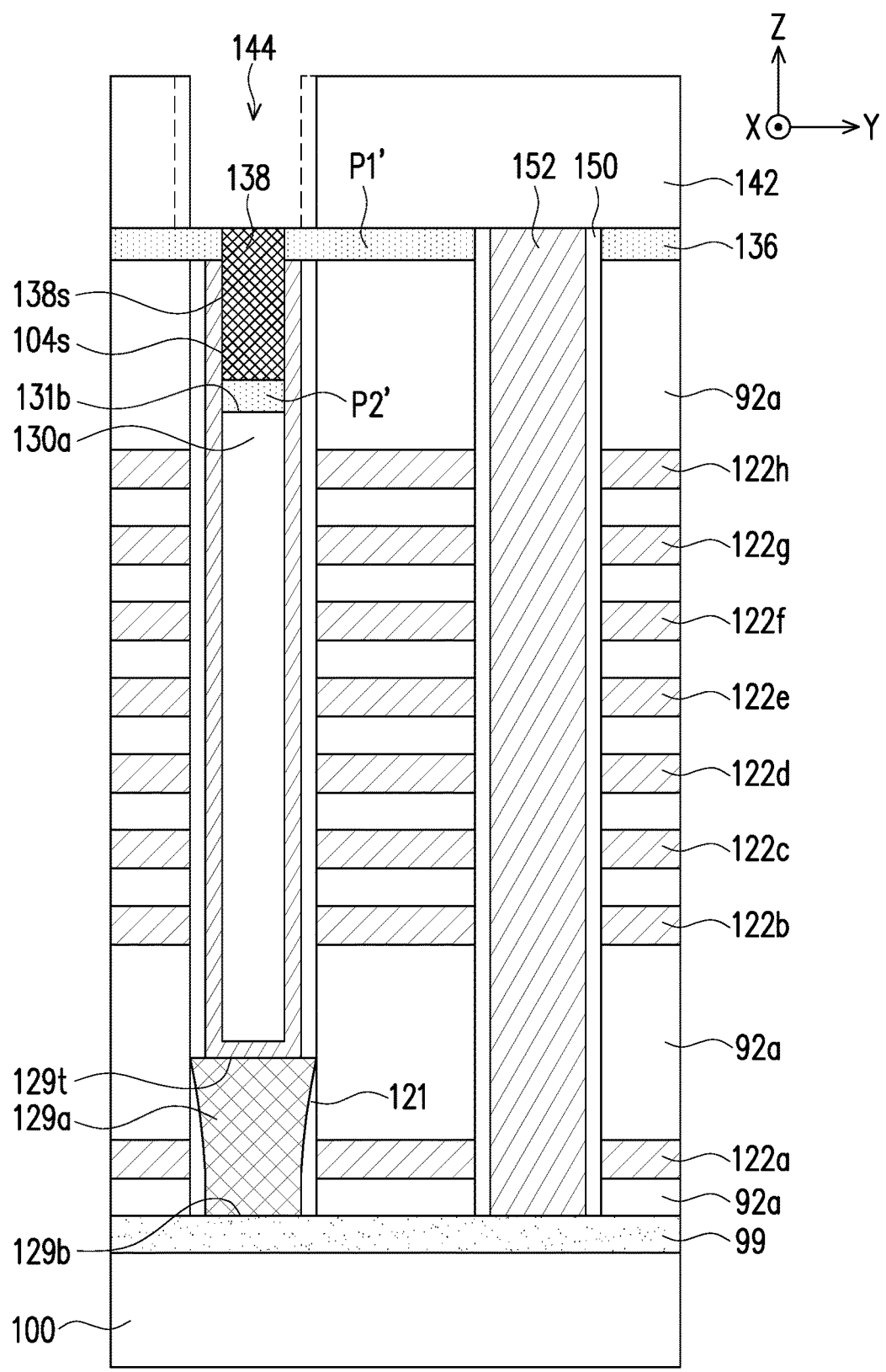

Thereafter, referring to FIG. 1G, a dielectric layer 142 is formed on the first stop layer P1' and the contact plug 138. The dielectric layer 142 and the first stop layer P1' have different materials. The dielectric layer 142 includes silicon oxide, silicon nitride, silicon oxynitride or a combination thereof formed by, for example, a chemical vapor deposition.

Next, referring to FIG. 1G and FIG. 2, a lithography process and an etching process are performed to form a contact opening 144 in the dielectric layer 142. The contact opening 144 exposes the first stop layer P1' and the contact plug 138. Since the first stop layer P1 'and the dielectric layer 142 have different materials, the first stop layer P1' may be used as an etch stop layer during the etching process. Therefore, even if misalignment occurs and the contact opening is offset (as indicated by the dashed line), the first stop layer P1' may protect the charge storage layer 102a and the channel layer 104a from being damaged by the etching process. Therefore, the process window may be enlarged. Furthermore, the first stop layer P1' may be used as an etch stop layer during the etching process, therefore, even if the contact opening 144 having a larger size is to be formed, the charge storage layer 102a and the channel layer 104a may not be damaged by the etchant during the etching process for forming the contact opening 144. In some embodiments, the orthogonal projection area of the contact opening 144 projected on the first stop layer P1' is greater than or equal to the orthogonal projection area of the pillar 134 projected on the first stop layer P1'.

Figure 1H:
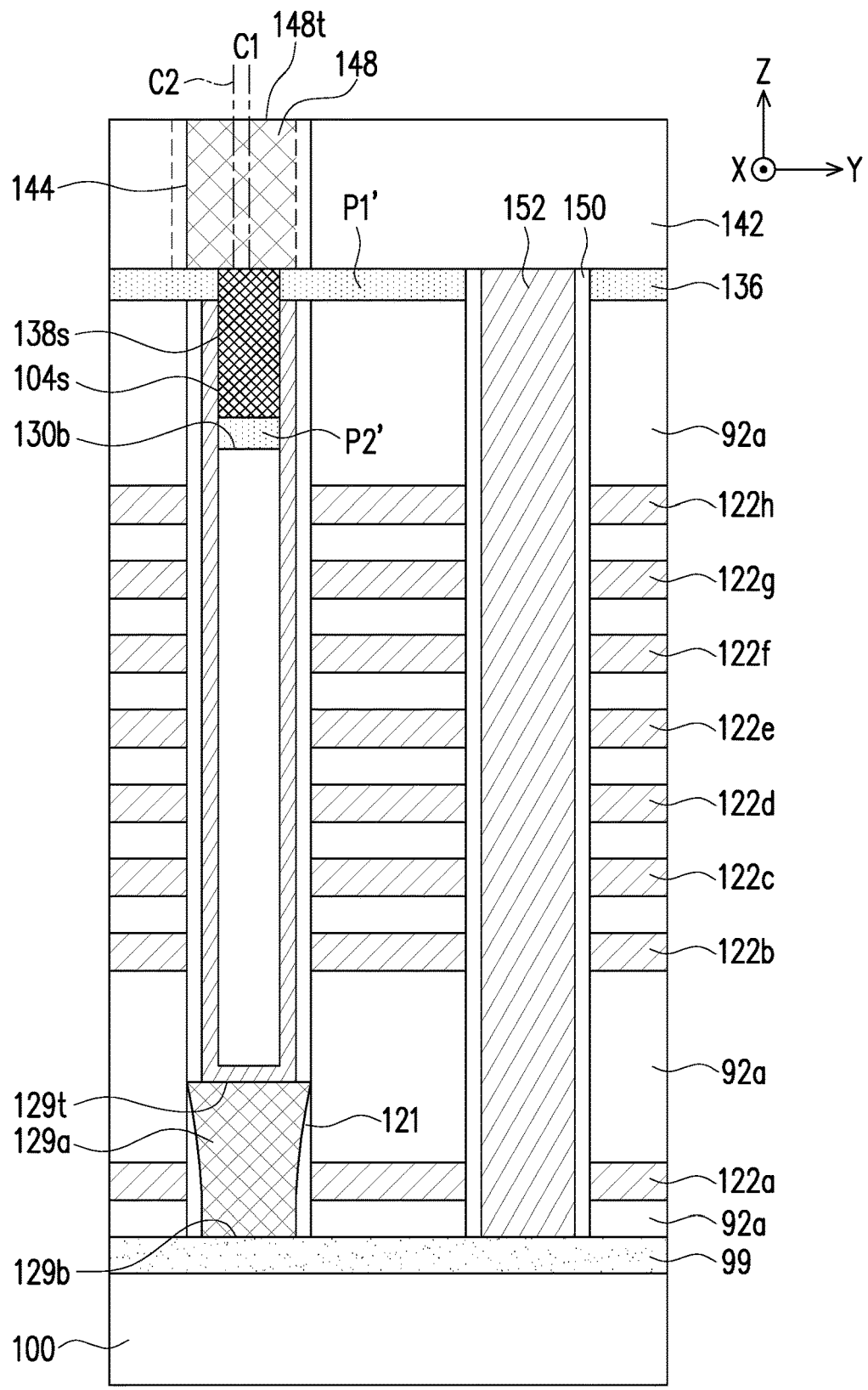
Figure 2:
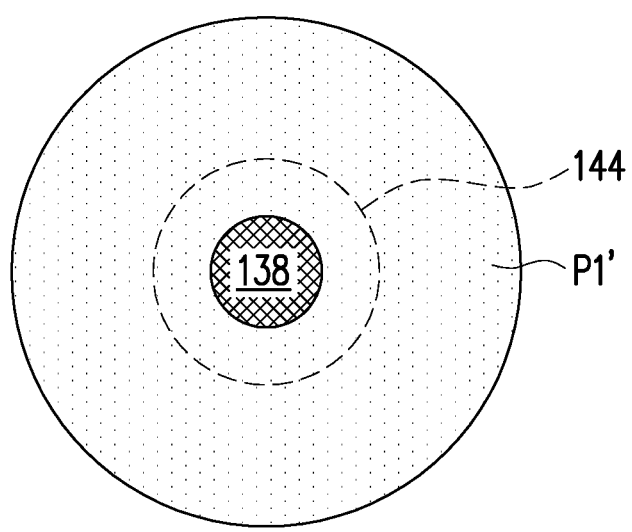
FIG. 2 is a top view of FIG. 1H.

Referring to FIG. 1G and FIG. 1H, a contact 148 is formed in contact opening 144 of dielectric layer 142. The contact 148 includes a semiconductor, a metal, a metal alloy, or a combination thereof. The material of contact 148 is, for example, doped polysilicon, tungsten, platinum, or a combination thereof. The contact 148 is formed, for example, as follows. A conductive material layer is formed to cover the dielectric layer 142 and fill the contact opening 144. Thereafter, an etching back or a chemical mechanical polishing process is performed to remove the conductive material layer on the dielectric layer 142.

A top surface 148t of the contact 148 may be coplanar with a top surface 142t of the dielectric layer 142, or slightly below the top surface 142t of the dielectric layer 142. A bottom surface 148b of the contact 148 may be coplanar with a bottom surface 142b of the dielectric layer 142. In addition, the bottom surface 148b of the contact 148 is in physical contact with the contact plug 138. The contact 148 is physically and electrically connected to the channel layer 104a through the contact plug 138. In an embodiment, the contact 148 may be used as a drain contact, and the contact 129a may be used as a source contact. The channel layer 104a close to the top surface of the stacked structure 101 is in physical contact with the sidewalls 138s of the contact plug 138, and is electrically connected to the drain by the contact plug 138. The channel layer 104a close to the top bottom surface of the stacked structure 101 is in physical contact with the contact 129a, and is electrically connected to the doped region (source region) 99 in the substrate 100 by the contact 129.

In this embodiment, the area where contact 148 may land is not limited to the contact plug 138. The contact 148 may not only land on the contact plug 138, but also land on the first stop layer P1'. In some embodiments, the bottom surface 148b of the contact 148 is not only in physical contact with the contact plug 138 but also physically in contact with the first stop layer P1'. In the Z direction (normal direction of the substrate 100 surface), the contact 148 is separated from the charge storage layer 102a of the pillar 134 by the first stop layer P1' and is spaced apart from the channel layer 104a. In some embodiments, the orthogonal projection area of the contact 148 projected on the first stop layer P1' may be equal to or greater than the orthogonal projection area projected by the pillar 134 at the first stop layer P1'. When the lithography process that forms the contact opening 144 is fully aligned, the centerline C2 of the contact 148 coincides with the centerline C1 of the pillar 134. When misalignment occurs in the lithography process that forms the contact opening 144 (as indicated by the dashed line in the FIG. 1K), the centerline C2 of the contact 148 is offset.

The above vertical channel memory is illustrated as having a bottom source structure, however, the present disclosure is limited to this. The disclosure may be used in a variety of vertical channel memories. The following is an example of a vertical channel memory having a hemi-cylindrical structure.

FIG. 3A to FIG. 3F is a schematic cross-sectional view showing the fabricating process of the second embodiment of the present disclosure. FIG. 4 is a top view of a memory device of the second embodiment of the present disclosure. The same or similar reference numerals are used for the same or similar elements, and the following paragraphs will not be repeated.

Figure 3A:
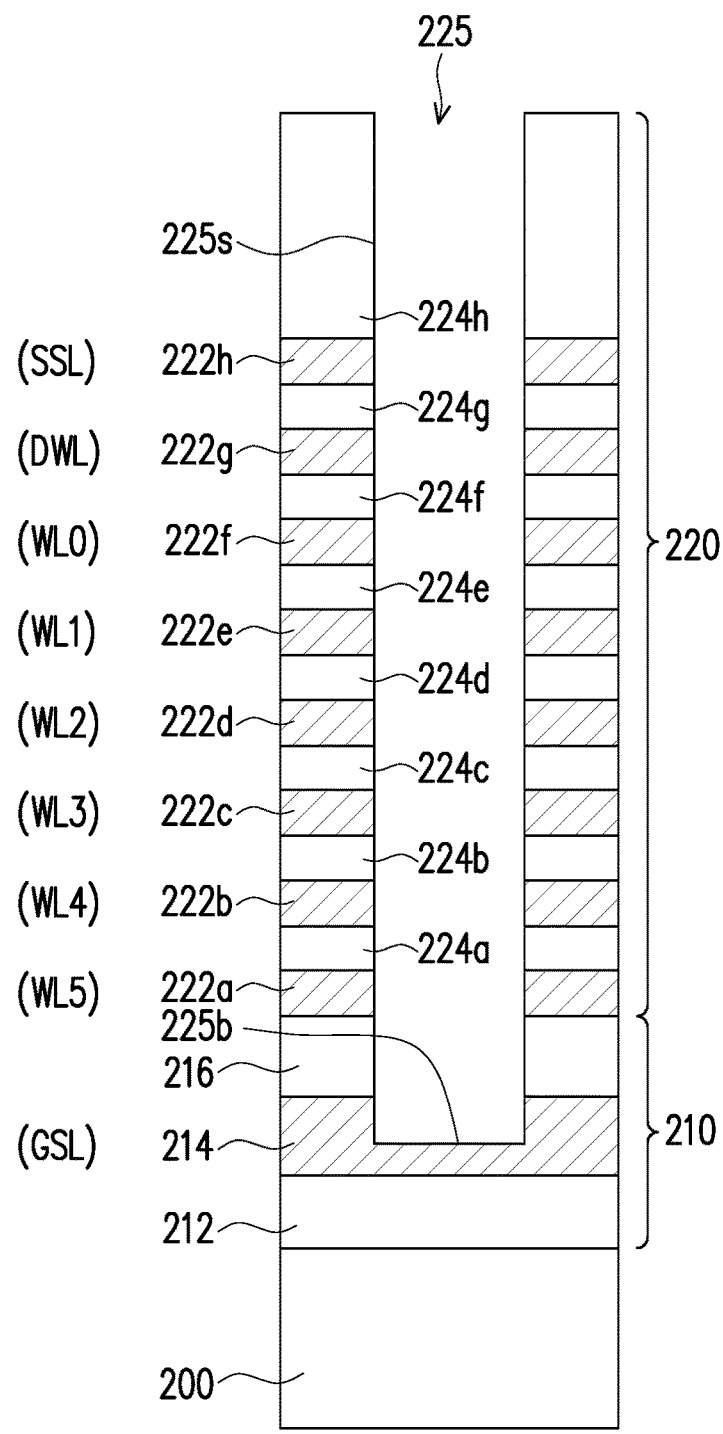
FIG. 3A to FIG. 3F are a schematic cross-sectional view showing a fabricating process of a memory device according to a second embodiment of the present disclosure.

Referring to FIG. 3A, a stacked structure 201 is formed on the substrate 200. The stacked structure 201 includes a first stacked structure 210 and a second stacked structure 220. The first stacked structure 210 includes a bottom dielectric layer 212, a conductive layer 214, and a top dielectric layer 216 stacked along the Z direction. The second stacked structure 220 includes a plurality of conductive layers 222a, 222b, 222c, 222d, 222e, 222f, 222g, 222h and a plurality of electric layer 224a, 224b, 224c, 224d, 224e, 224f, 224g, 224h which are alternately stacked along the Z direction. The number of layers of the conductive layers and the number of layers of the dielectric layer layers in the stacked structure 201 may be respectively greater than 16 and may be 8, 16, 32, 56, 64, or 96, for example. In an embodiment, the conductive layers 214, 222a, 224b, 224c, 224d, 224e, 224f, 224g, 224h include doped semiconductor materials (e.g., silicon, germanium or a combination thereof), metal materials (e.g., tungsten, platinum or a combination thereof) and a conductive compound (e.g., titanium nitride, tantalum nitride, silicon carbide, or a combination thereof). In an embodiment, the bottom dielectric layer 212, a top dielectric layer 216, and the dielectric layer 224a, 224b, 224c, 224d, 224e, 224f, 224g, 224h includes silicon oxide, silicon nitride, silicon oxynitride, a suitable dielectric material, or a combination thereof. In some embodiments, the materials of the dielectric layers 224a, 224b, 224c, 224d, 224e, 224f, 224g, 224h may be the same (for example, all of silicon oxide). In the alternative embodiment, the materials of the dielectric layers 224a, 224b, 224c, 224d, 224e, 224f, 224g, 224h may be different from each other. For example, the material of the dielectric layer 224a, 224b, 224c, 224d, 224e, 224f, 224g, 224h may be silicon oxide; the material of the topmost dielectric layer 124h may be silicon nitride. When the topmost dielectric layer 224h is a silicon nitride layer, the topmost dielectric layer 124h may be used to provide tensile stress. Alternatively, the topmost dielectric layer 224h may be used as a reinforced structure when the opening 225 (shown as FIG. 3B) with a high aspect ratio is subsequently formed to avoid the stacked structure 201 bending.

In some embodiments, the conductive layers 214 of the first stacked structure 210 may be used as an inversion gate control gate. The topmost conductive layer 222*h* may be a string select line (SSL). The conductive layers 222*g* may be a dummy word line (DWL). The conductive layers 222*f*, 222*e*, 222*d*, 222*c*, 222*b* and 222*a* may be word lines WL0, WL1, WL2, WL3 WL4, and WL5. The dummy word line DWL may be disposed below the string select line SSL and above the topmost word line, or below the bottom word line, or a combination thereof. The dummy word line may have one layer, two layers, or multiple layers. Although the FIG. 3A only shows six word lines WL0, WL1, WL2, WL3, WL4, and WL5, the present disclosure is not limited thereto.

Thereafter, the opening 225 is formed which penetrates the second stacked structure 220 and extends to a portion of the first stacked structure 210. The opening 225 extends into the conductive layers 214 of the first stacked structure 210. A partial sidewalls 225*s* of the opening 225, and a bottom surface 225*b* expose the conductive layers 214 of the first stacked structure 210. The opening 225 may be a hole. The cross-sectional view of the opening 225 may circular-shaped, oval-shaped, the like or any other suitable shaped. The number of opening 225 may be multiple.

Figure 3B:
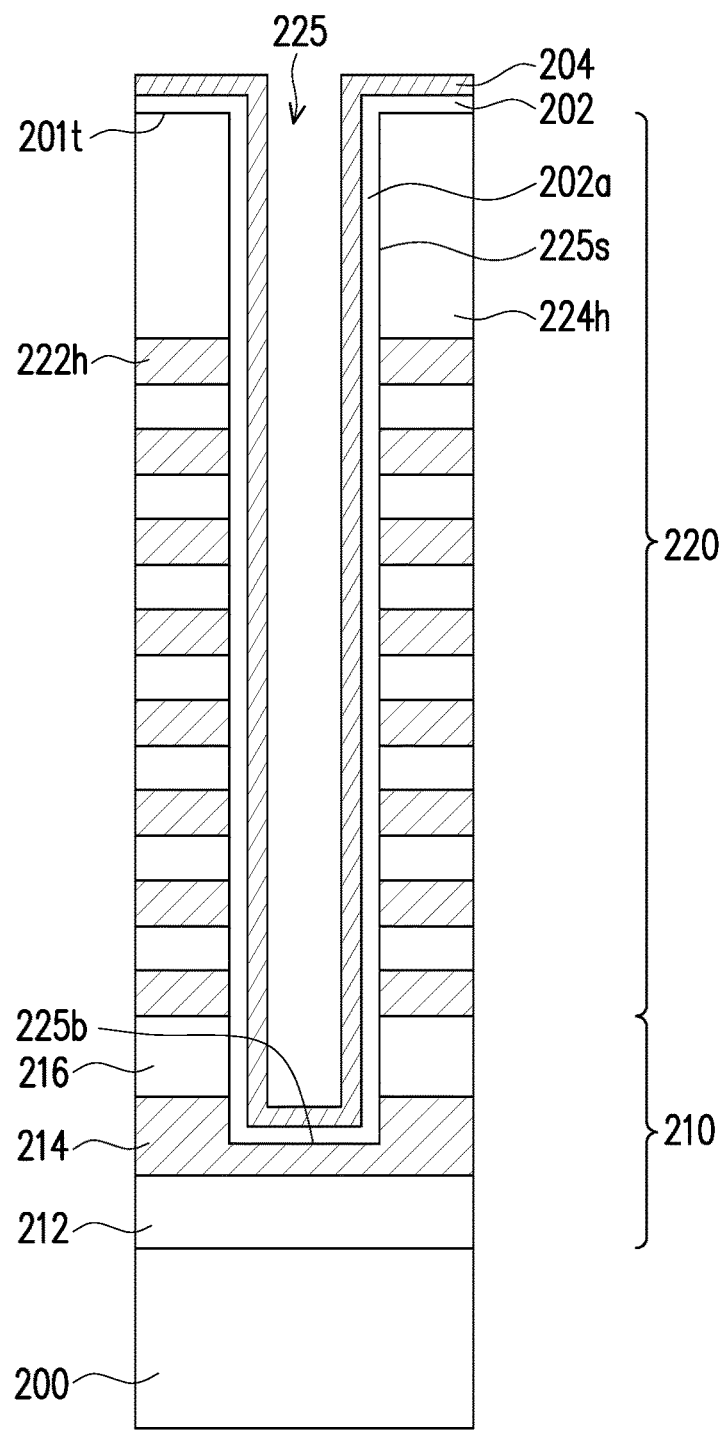
Figure 4:
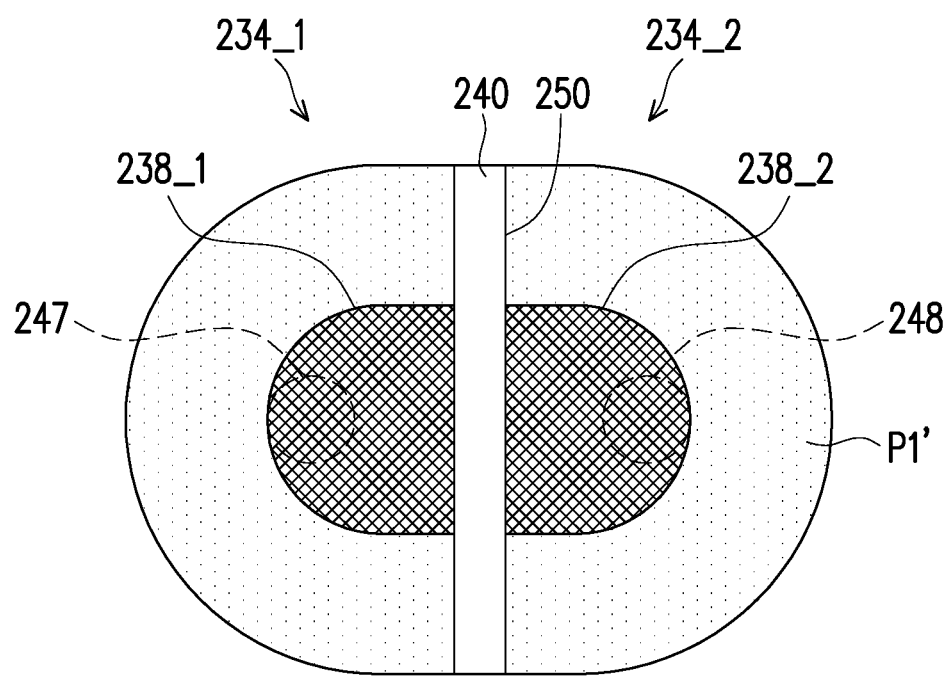
FIG. 4 is a top view of a memory device of the second embodiment of the present disclosure.

Referring to the FIG. 3B, after the opening 225 is formed a charge storage layer 202 and a channel layer 204 are formed in the opening 225. The charge storage layer 202 and the channel layer 204 cover a top surface 201*t* of the stacked structure 201 and sidewalls 225*s* and a bottom surface 225*b* of the opening 225.

Thereafter, an insulating filler 230*a* is formed in the opening 225. At the time of forming the insulating filler 230*a*, the charge storage layer 202 and the channel layer 204 still cover the sidewalls 225*s* and the bottom surfaces 225*b* of the opening 225. In other words, the conductive layers 214 of the first stacked structure 210 are not in physical contact with the channel layer 204, but are separated by the charge storage layer 202. Next, referring to the FIG. 3C, the charge storage layer 202*a* and the channel layer 204*a* on the stacked structure 201 are removed, leaving the charge storage layer 202*a* and the channel layer 204*a* in the opening 225. Thereafter, a first stop layer P1', a second stop layer P2', and a contact plug 238 are formed.

Figure 3C:
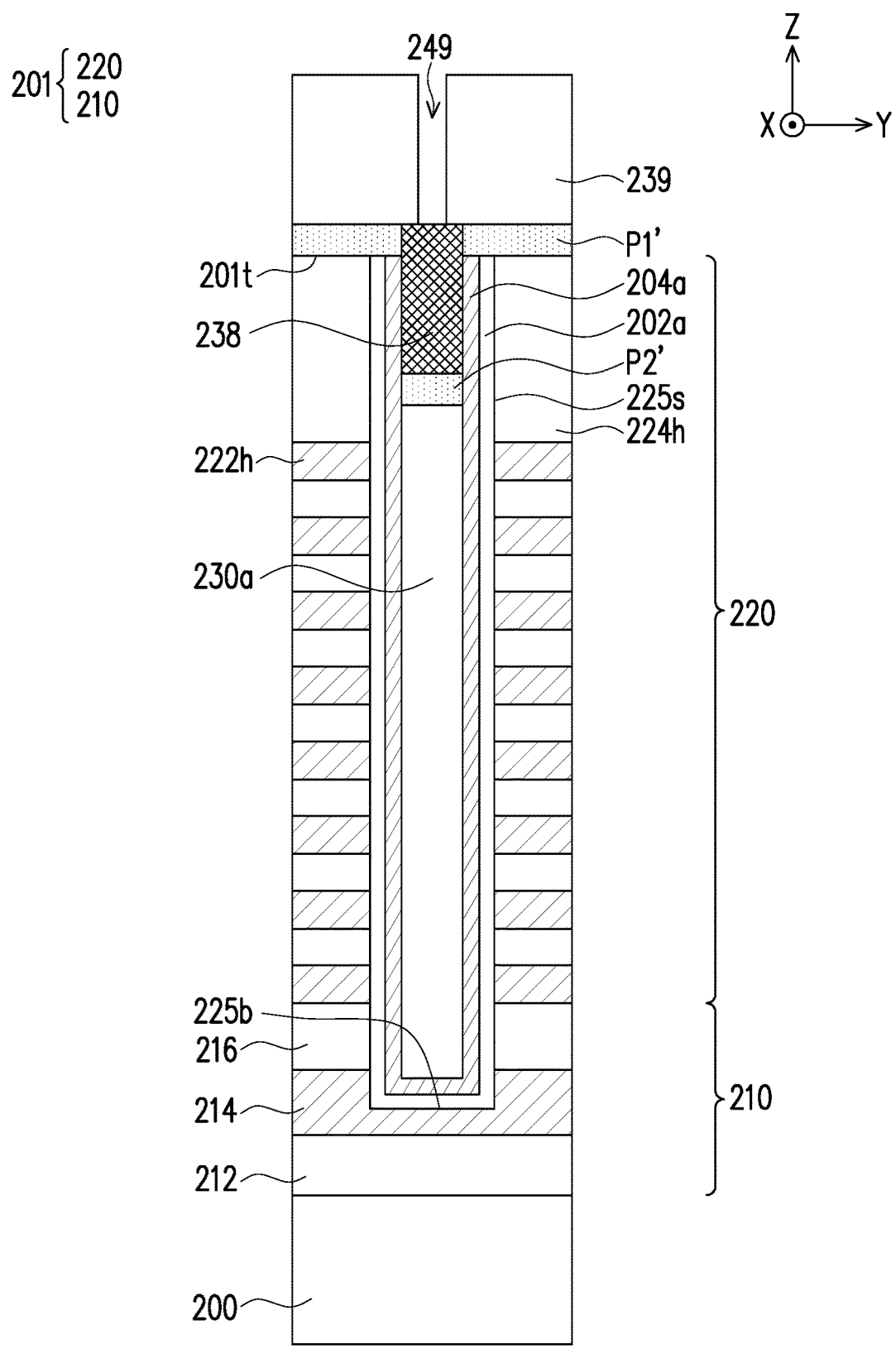
Figure 3D:
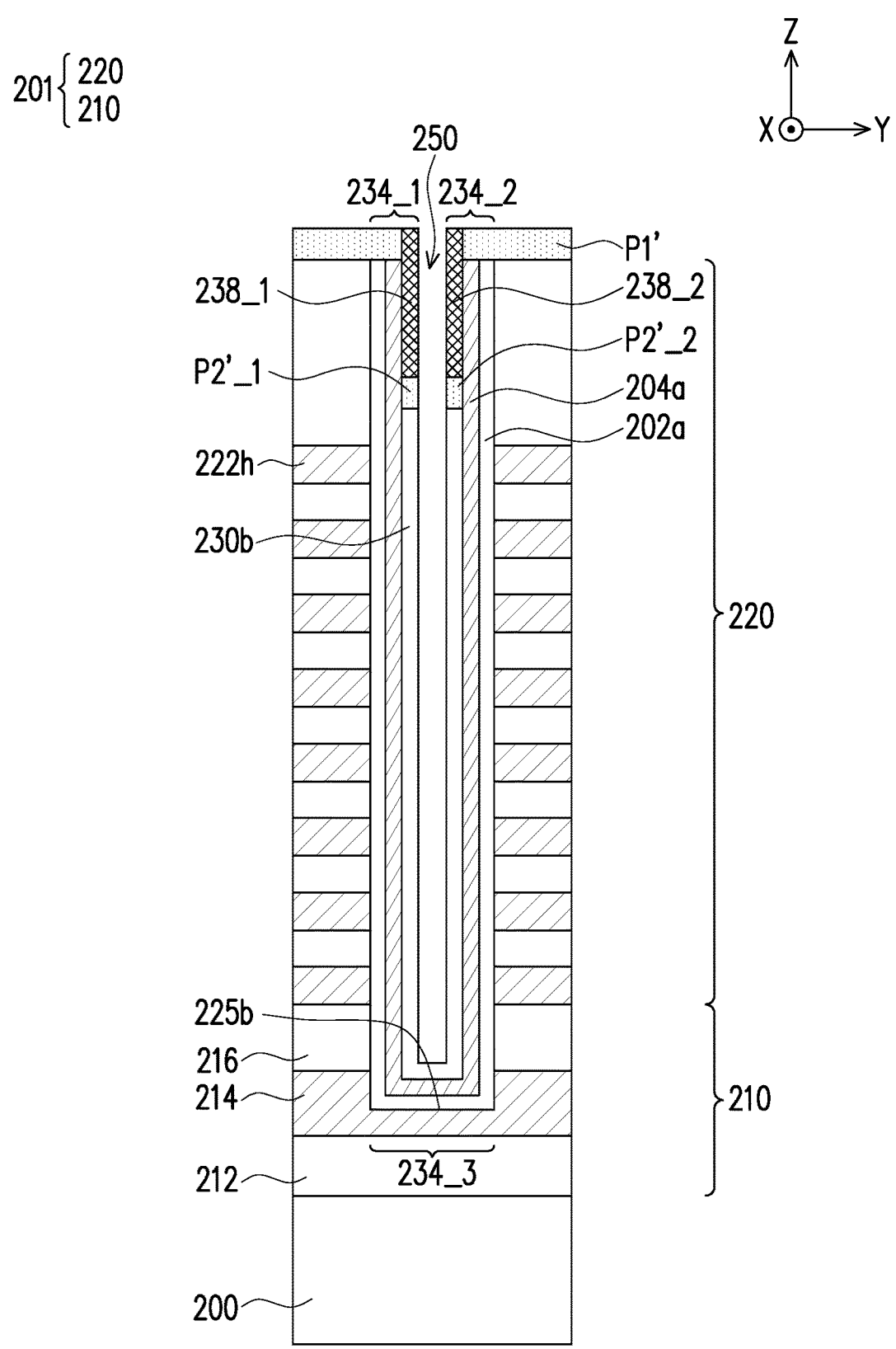

Referring to FIG. 3C and FIG. 3D, a mask pattern 239 is formed on the first stop layer P1' and the contact plug 238. The mask pattern 239 has an opening 249 that exposes the contact plug 238. In some embodiments, the opening 249 may simultaneously expose multiple contact plugs 238 of the same column or same row and the first stop layer P1' between two adjacent contact plugs 238 (not shown). Thereafter, an etching process, for example, an anisotropic etching process is performed to etch the contact plug 238 and the second stop layer P2' and the insulating filler 230*a* exposed by the opening 249 to form an opening 250. Thereafter, the mask pattern 239 is removed.

Referring to FIG. 3D, the opening 250 divides the contact plug 238 into a first plug 238_1 and a second plug 238_2 which are separated from each other, and divides the second stop layer P2' into a first portion P2'_1 and a second portion P2'_2 which are separated from each other. Moreover, the opening 250 is formed such that the cross-section of the insulating filler 230*b* has a cup-shaped or a U-shaped structure. In other words, the opening 250 divides the pillar 234 into a first pillar 234_1, a second pillar 234_2, and a connection part 234_3. The first pillar 234_1 is located on a first side of the opening 250, the second pillar 234_2 is located on a second side of the opening 250, and the connection part 234_3 is located at a bottom of the opening 250, connecting the first pillar 234_1 and the second pillar 234_2.

Figure 3E:
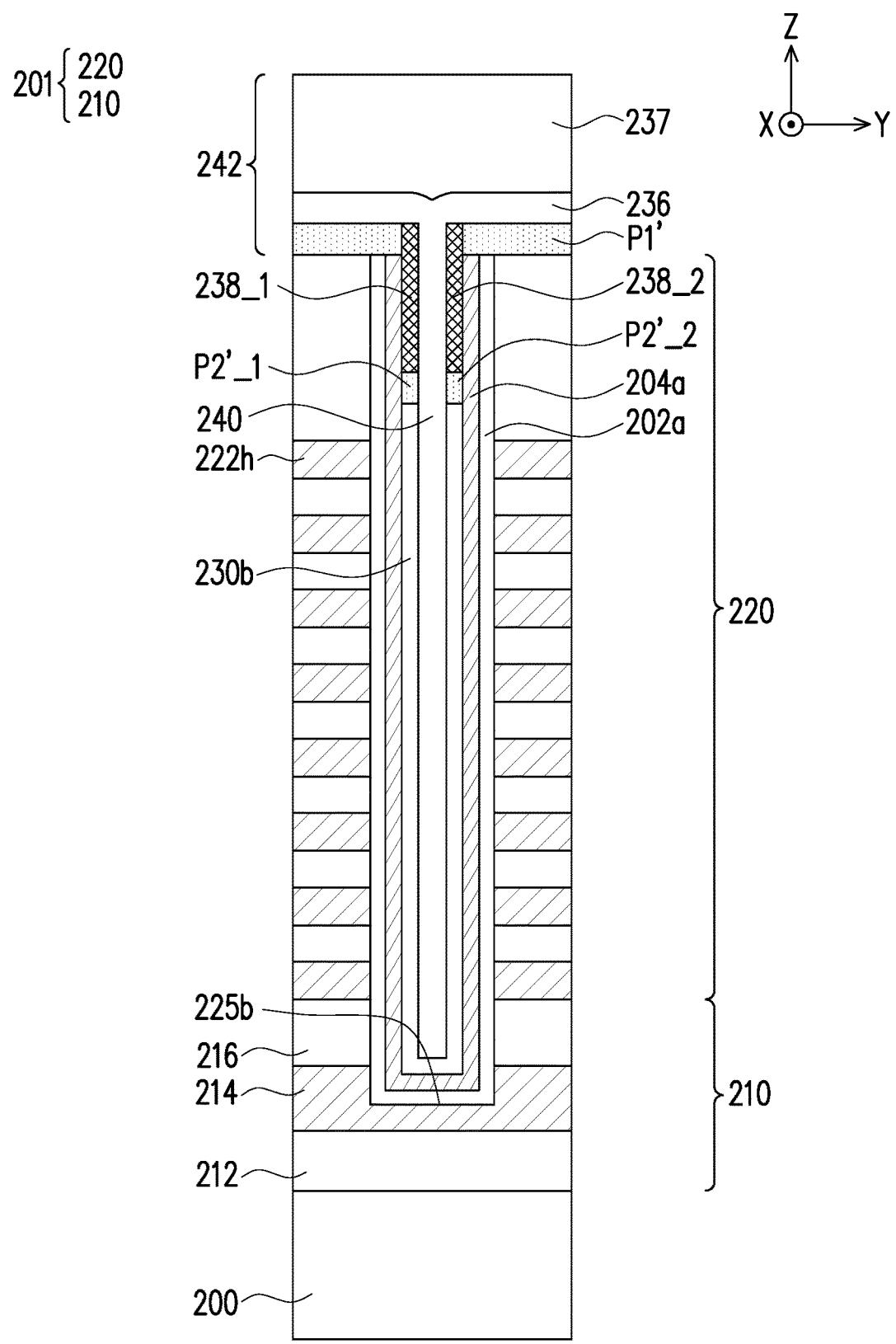

Referring to FIG. 3E, a separation material layer 236 is formed on substrate 200 and in the opening 250. Thereafter, a dielectric material layer 237 is formed on the substrate 200. The separation material layer 236 in opening 250 is referred to as an insulating separator (or referred to as a slit) 240. The separation material layer 236 and the dielectric material layer 237 on the first stop layer P1' may be collectively referred to as a dielectric layer 242. Before the formation of the dielectric material layer 237, an etch back process or a planarization process may be performed on the separation material layer 236 first. The separation material layer 236 includes an insulating material, and the material of the separation material layer 236 may be the same as or different from the insulating filler 230*b*. The dielectric material layer 237 includes an insulating material that may be the same or different from the separation material layer 236.

Thereafter, a lithography process and an etching process are performed to form a first contact opening 245 and a second contact opening 246 in the dielectric layer 242. Similarly, during the etching process that forms the first contact opening 245 and the second contact opening 246, the first stop layer P1' may protect the underlying charge storage layer 202*a* and the channel layer 204*a* from etch damage.

Thereafter, a first contact 247 and a second contact 248 are formed in the first contact opening 245 and the second contact opening 246, respectively. The materials and formation methods of the first contact 247 and the second contact 248 are similar to those of the above-described contact 148, and will not be described herein. A top surface 247*t* of the first contact 247 and a top surface 248*t* of the second contact 248 may be coplanar with a top surface 242*t* of the dielectric layer 242, or slightly below the top surface 242*t* of the dielectric layer 242. A bottom surface 247*b* of the first contact 247 and a bottom surface 248*b* of the second contact 248 may be coplanar with the bottom surface 242*b* of the dielectric layer 242. The first contact 247 and the second contact 248 are separated by the dielectric layer 242.

Figure 3F:
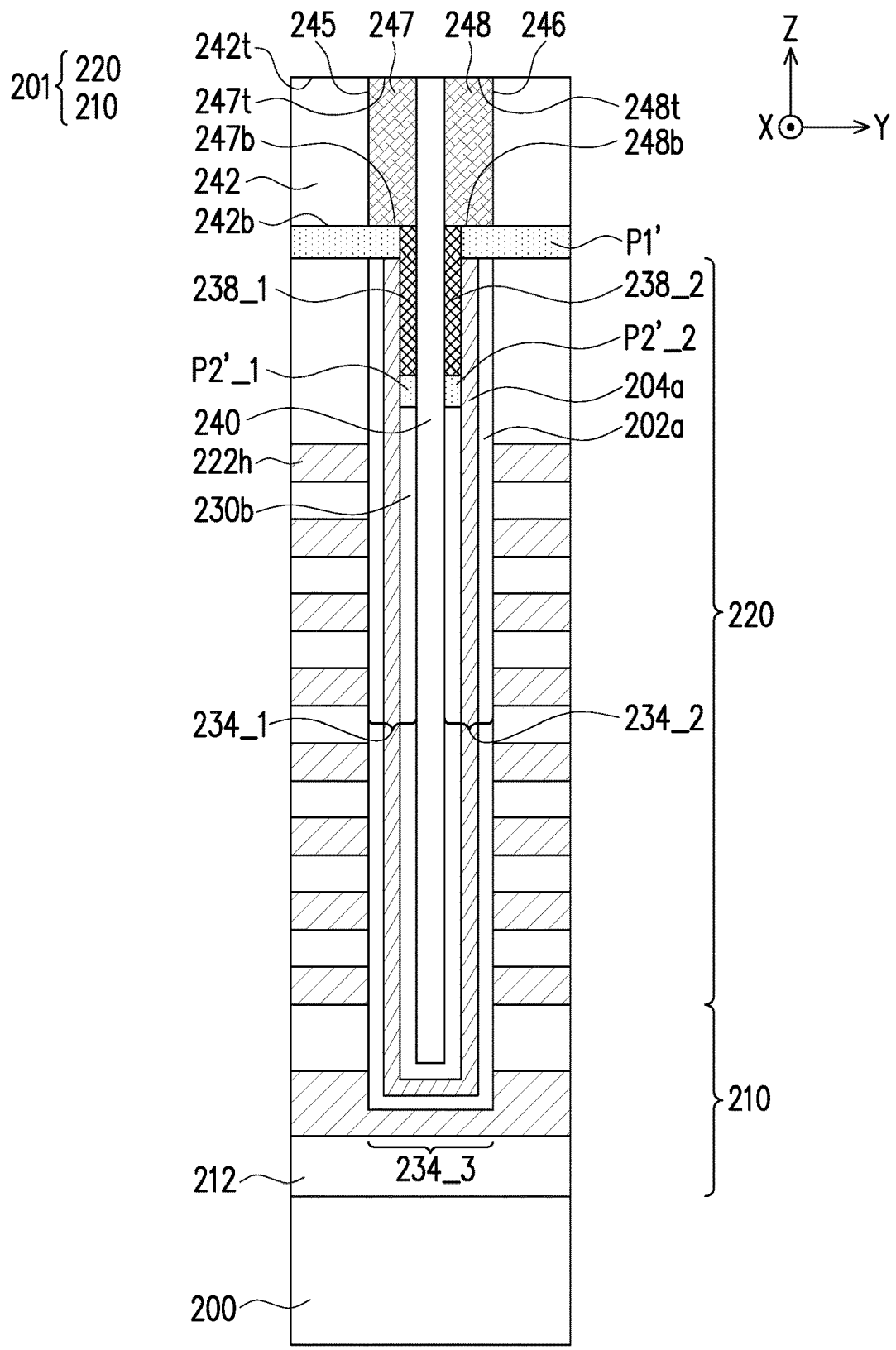

Referring to FIG. 3F, in this embodiment, the first contact 247 may be used as a source contact, and the second contact 248 may be used as a drain contact. The bottom surface 247*b* of the first contact 247 is in physical and electrical contact with the first plug 238_1 on the first side of the insulating separator 240. Sidewalls of the first plug 238_1 are in physical and electrical contact with the channel layer 204*a* on the first side of the insulating separator 240. The bottom surface 248*b* of the second contact 248 is in physical and electrical contact with the second plug 238_2 on the second side of the insulating separator 240. Sidewalls of the second plug 238_2 are in physical and electrical contact with the channel layer 204*a* on the second side of the insulating separator 240. In other words, the first contact 247 is in physically and electrically contact with the channel layer 204*a* on the first side of the insulating separator 240 by the first plug 238_1. The second contact 248 is in physical and electrical contact with the channel layer 204*a* on the second side of the insulating separator 240 by the second plug 238_2.

Referring to FIG. 3F and FIG. 4, in some embodiments, the first contact 247 and the second contact 248 may only land on the first plug 238_1 and the second plug 238_2 (as shown in FIG. 4). In some other embodiments, the first contact 247 and the second contact 248 may not only land on the first plug 238_1 and the second plug 238_2, but also land on the first stop layer P1' (as shown in FIG. 3F). In other words, the bottom surface 247*b* of the first contact 247 and the bottom surface 248*b* of the second contact 248 are not only in physical contact with the first plug 238_1 and the second plug 238_2, but also physically in contact with the first stop layer P1'. In the Z direction (normal direction of the substrate 200 surface), the first contact 247 is separated from the charge storage layer 202a and the channel layer 204a of the first pillar 234_1 by the first stop layer P1'. The second contact 248 is separated from the charge storage layer 202a and the channel layer 204a of the second pillar 234_2 by the first stop layer P1'.

In the embodiments of the present disclosure, after the charge storage layer and the channel layer are formed in the opening of the stacked structure and before the contact plug is formed, the stop layer is formed on the stacked structure, the charge storage layer and the channel layer. Since the stop layer may protect the charge storage layer and the channel layer from etch damage, the area where the subsequently formed contact may land is not limited to the contact plug, but may also land on the stop layer. Therefore, the disclosure of the disclosure may increase the process window and improve the reliability of the memory device with the vertical channel structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of fabricating a memory device, comprising:
   forming a stacked structure on the substrate;
   forming a pillar in the stacked structure, wherein the pillar has a recess thereon;
   forming a stop material layer on the stacked structure and the pillar and in the recess;
   removing the stop material layer on sidewalls of the recess to form a first stop layer on the stacked structure, and a second stop layer on a bottom surface of the recess;
   forming a contact plug in the recess;
   forming a dielectric layer on the first stop layer and the contact plug; and
   forming a contact in the dielectric layer, wherein the contact is electrically connected to the contact plug.

2. The method of claim 1, wherein the stop material layer comprises:
   a first portion, located on a top surface of the stacked structure;
   a second portion, located on the bottom surface of the recess;
   a third portion, located on the sidewalls of the recess,
   wherein a thickness of the first portion is greater than a thickness of the second portion, and the thickness of the second portion is greater than a thickness of the third portion.

3. The method of claim 2, further comprising:
   removing a plurality of sacrifice layers of the stacked structure to form a plurality of lateral openings before the forming the dielectric layer; and
   forming a plurality of conductive layers in the plurality of lateral openings,
   wherein the pillar comprises a plurality of series-connected memory cells located in a layout pattern of pillar locations at cross-points between the pillar and the conductive layers.

4. The method of claim 1, wherein the stacked structure comprises a plurality of conductive layers, and the pillar comprises a plurality of series-connected memory cells located in a layout pattern of pillar locations at cross-points between the pillar and the conductive layers.

5. The method of claim 4, further comprising:
   before forming the contact in the dielectric layer, forming an opening in the contact plug, the second stop layer and the pillar, wherein the contact plug is divided into a first plug and a second plug by the opening;
   forming an insulating separator in the opening; and
   the forming the contact in the dielectric layer comprises:
   forming a first contact in the dielectric layer, wherein the first contact is electrically connected to the first plug; and
   forming a second contact in the dielectric layer, wherein the second contact is electrically connected to the second plug.

6. The method of claim 5, wherein the pillar comprises an insulating filler, the stop material layer covers the insulating filler, and the opening extends into the insulating filler.

7. The method of claim 1, wherein the forming the pillar in the stacked structure comprises:
   forming a hole in the stacked structure;
   forming a charge storage layer on sidewalls of the hole;
   forming a channel layer in the hole to cover the charge storage layer;
   forming an insulating filler in the hole to cover the channel layer; and
   etching back the insulating filler to form the recess.

8. The method of claim 7, further comprising before forming the pillar in the stacked structure, forming another contact in the stacked structure, wherein the another contact to is in contact with the substrate and the pillar.

* * * * *